United States Patent [19]

Kalish et al.

[11] 3,735,210

[45] May 22, 1973

[54] ZENER DIODE FOR MONOLITHIC INTEGRATED CIRCUITS

[75] Inventors: Israel Haim Kalish, Plainfield; Heshmat Khajezadeh, Somerville, both of N.J.

[73] Assignee: RCA Corporation, New York, N.Y.

[22] Filed: June 7, 1971

[21] Appl. No.: 150,795

Related U.S. Application Data

[63] Continuation of Ser. No. 831,883, June 6, 1969, abandoned.

[52] U.S. Cl. ......317/234 R, 317/235 T, 317/235 AM

[51] Int. Cl. ........................................H01l 9/00

[58] Field of Search ......................317/235 X, 235 T, 317/235 AM, 234 Q

[56] References Cited

UNITED STATES PATENTS 3,305,913 2/1967 Loro ....................................317/235
3,347,720 10/1967 Bryan et al. ..........................317/235

*Primary Examiner*—Jerry D. Craig
*Attorney*—Glenn H. Bruestle

[57] ABSTRACT

An improved zener diode for monolithic integrated circuits includes a first diffused region of one type conductivity having two portions, one of which portions has a significantly higher maximum impurity concentration than the other portion. A second diffused region of opposite type high conductivity is disposed within both portions of the first region and is separated from each by a PN junction, the PN junction between the second region and the lower conductivity portion being at a significantly greater depth than the PN junction between the second region and the high impurity concentration portion. The electrical contact to the second region is made only over the lower impurity concentration portion where the PN junction is at a significantly greater depth.

4 Claims, 7 Drawing Figures

Patented May 22, 1973

3,735,210

2 Sheets-Sheet 1

INVENTORS
Israel Haim Kalish and
Heshmat Khajezadeh.
BY
ATTORNEY

INVENTORS
Israel Haim Kalish and
Heshmat Khajezadeh
BY [signature]
ATTORNEY

ZENER DIODE FOR MONOLITHIC INTEGRATED CIRCUITS

CROSS REFERENCE TO RELATED APPLICATION

This is a continuation of Application Ser. No. 831,883, filed June 6, 1969 now abandoned.

BACKGROUND OF THE INVENTION

This invention relates to semiconductor rectifying junction devices. More particularly, the invention relates to P+N+ zener diodes useful in monolithic integrated circuits.

Heretofore, many zener diodes in monolithic integrated circuits have been fabricated by diffusing a first region of one type high conductivity into the integrated circuit, and then diffusing a second region of opposite type high conductivity into a part of the first region; usually by diffusing an N+ region into a diffused P+ region. The impurity concentration of both regions has been very high, and the P+N+ junction between them has been at a shallow depth, usually less than one micrometer. The shallowness of the P+N+ junction has caused many of the diodes to become leaky or shorted out when electrical contacts were alloyed to the diode. Aluminum was generally used for the electrical contacts, and when the aluminum was heated to a temperature sufficient to alloy it to the semiconductor material, it would penetrate the surface, spiking into the semiconductor body. In particular, the aluminum would spike through the second region and across the shallow P+N+ junction, thereby shorting the device and degrading the production yield.

The emitter-base junction of a diffused transistor has been used to perform zener diode functions, although such a junction has a relatively high breakdown voltage characteristic and the device has too much dynamic impedance for many applications. One form of known transistor has a base region with a relatively high conductivity portion for reducing the bulk resistivity of the base region. The emitter region in this device does not contact the high conductivity portion of the base, however, because if it did poor injection efficiency and breakdown characteristics inappropriate to its operation as a transistor would result. Consequently, this device cannot be used as a zener diode in many applications.

SUMMARY OF THE INVENTION

The improved zener diode includes a body of semiconductor material with a first diffused region of one type conductivity comprising two portions, one of the portions having a high maximum impurity concentration and the other portion having a significantly lower maximum impurity concentration. A second region of opposite type high conductivity is connected to both portions of the first region and is separated from each by a PN junction, at least part of the PN junction between the second region and the high impurity concentration portion being defined by the zones of maximum impurity concentration of each, a part of the PN junction between the second region and the lower impurity concentration portion being at a significantly greater depth than the PN junction between the second region and the high impurity concentration portion. The electrical contact to the second region is made only over the lower impurity concentration portion where the PN junction is at a significantly greater depth.

THE DRAWINGS

THE PREFERRED EMBODIMENT

Figure 1:
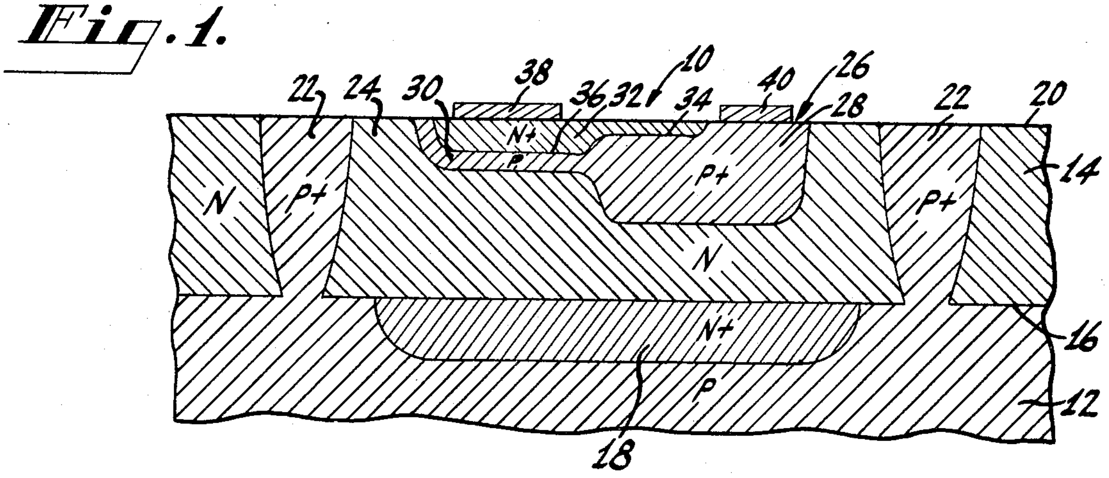
FIG. 1 is a cross-sectional schematic view of a part of a monolithic integrated circuit which includes the improved zener diode.

FIG. 1 is a cross-sectional schematic view of a part of a monolithic integrated circuit which includes the improved zener diode 10. The integrated circuit comprises a semiconductor substrate 12 and an epitaxial layer 14 disposed thereon and separated by a junction 16. In FIG. 1, the substrate 12 is of P type conductivity, and may include an N+ pocket 18 adjacent the junction 16, as is well known in the prior art. The epitaxial layer 14 is of N type conductivity and has an exposed surface 20. A P+ collar 22 surrounds a part of the epitaxial layer 14 forming an N boat region 24 isolated from the remainder of the epitaxial layer 14. The N region 24 is electrically insulated from the remainder of the epitaxial layer 14 and usually contains one or more electrical devices; such as in FIG. 1, where the N region 24 contains the improved zener diode 10 adjacent the surface 20.

The improved zener diode 10 includes a first region 26 of one type conductivity having two diffused portions 28 and 30 laterally connected together and adjacent the surface 20; however, the portion 28 has a significantly higher maximum conductivity and impurity dopant concentration than the other portion 30. As is known, a diffused region has its zone of maximum concentration immediately adjacent to the opening in the masking coating through which it is formed, and the concentration decreases with distance from this location. In this example, the region 26 is of P type conductivity and comprises a P+ portion 28 and a P portion 30. The portion 28 also has a substantially greater depth than the portion 30. A second region 32 of opposite type high conductivity is connected to both portions 28 and 30 of the first region 26, and is also adjacent the surface 20. In FIG. 1, the second region 32 is of N+ conductivity and is disposed within both portions 28 and 30 overlapping the portion 28 to an extent sufficient to bring it adjacent to the zone of maximum conductivity thereof, thereby forming a P+N+ junction 34 with the P+ portion 28 and a PN+ junction 36 with the P portion 30. The PN+ junction 36 between the second region 32 and the lower impurity portion 30 is at a significantly greater depth than the P+N+ junction 34 between the second region 32 and the high impurity portion 28. Moreover, due to the degree of overlap mentioned above, a part of the junction 34 is within, i.e., it lies between, the zones of maximum impurity concentration of each of the regions 28 and 32.

Electrical connection is made by electrical contacts 38 and 40 which are alloyed to the surfaces of the N+ region 32 and the P+ region 28, respectively. The electrical contact 38 to the N+ region 32 is made only above the P portion 30 where the PN+ junction 36 is at a significantly greater depth.

Figure 2:
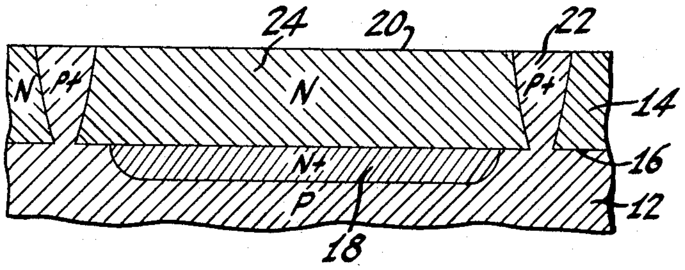
FIGS. 2 through 6 are cross-sectional schematic views illustrating several stages in a preferred fabrication process for the improved zener diode.

FIGS. 2 through 6 illustrate several stages in a preferred fabrication process for the improved zener diode 10 in a typical monolithic integrated circuit. FIG. 2 shows a part of the integrated circuit before the improved zener diode 10 is fabricated in it. The substrate 12 and the epitaxial layer 14 are made of monocrystalline silicon and have resistivities of 25–50 ohm-cm and 1–6 ohm-cm, respectively. The epitaxial layer 14 is grown to a thickness of about 10 to 14 micrometers and has an impurity dopant concentration of about $5 \times 10^{15}$ atoms/cm$^3$. The N+ pocket 18 and the P+ collar 22 may be formed by diffusion methods well known in the prior art.

Figure 3:
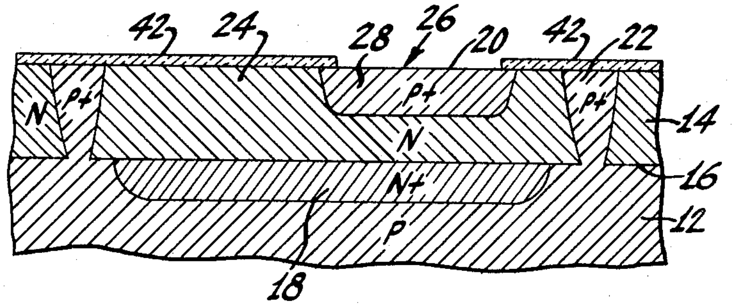

The first step in fabricating the improved zener diode 10 is to diffuse the P+ portion 28 of the region 26 into the N boat region 24. As shown in FIG. 3, the surface 20 is coated with a passivating layer 42, and a part of the passivating layer is removed to expose a part of the surface 20 above the N boat 24. Usually, this is done by depositing a layer of silicon dioxide to a thickness of 5,000–10,000 A and removing a part thereof by standard photoresist methods, as is well known in the prior art. A P+ diffusion is then performed by exposing the surface 20 to boron nitride for 45 minutes at 1,150° C and then to steam for 45 minutes at 1,165° C. The resulting P+ portion 28 diffuses deeply into the N region 24 to a depth of about 4.5 micrometers before its impurity concentration falls below that of the N region 24.

Figure 4:
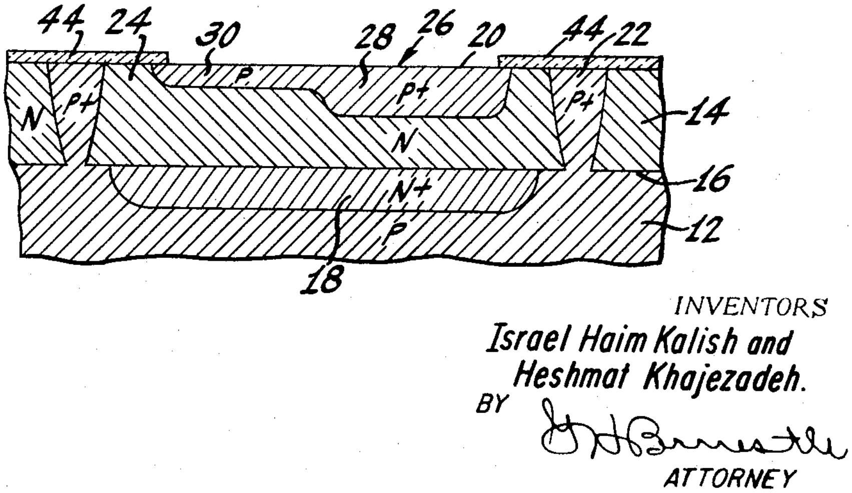

The P portion 30 of the first region 26 is then formed by diffusion. The oxide coating 42 is stripped away and a new oxide coating 44 is laid down and opened up to expose another part of the surface 20. As shown in FIG. 4, the oxide coating 44 is removed in the area adjacent the P+ portion 28 and a part of the N region 24 laterally connected to it, so that the following P diffusion forms laterally connected P and P+ portions 30 and 28 adjacent the surface 20. The P diffusion is performed by exposing the surface 20 to boron nitride for 40 minutes at 950° C, and then to dry atmosphere for 50 minutes and to a wet atmosphere for 50 minutes at 1,100° C. The same diffusion source, boron nitride, is used in both the P and P+ diffusions, but the lower deposition and diffusion temperatures for the P diffusion result in the P portion 30 having a significantly lower impurity concentration and diffusion depth. The P portion 30 only diffuses to a depth of about 2.0 micrometers before its impurity concentration falls below that of the N region 24. Usually, this P diffusion is made at the same time the base and resistor diffusions are made in other parts of the integrated circuit, and thus eliminates the need for an additional diffusion step.

Figure 5:
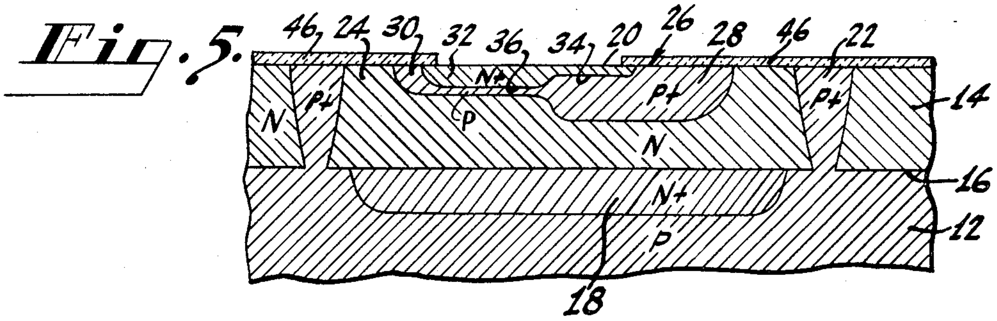

The N+ region 32 is then formed by diffusion. The oxide coating 44 is removed and a new oxide coating 46 is laid down and opened up to expose another part of the surface 20. As shown in FIG. 5, the oxide coating 46 is removed in part of the area adjacent both the P+ portion 28 and the P portion 30 of the region 26. In other words, the N+ diffusion is done through a portion of the surface 20 which overlaps both the surface portions through which the P+ portion 28 and the P portion of the region 26 were diffused. The N+ diffusion may then be performed by exposing the surface 20 to $POCl_3$ for 18 minutes at 1,050° C and then to steam for 45 minutes at 945° C. The resulting N+ region 32 is disposed within both portions of the first region 26, forming the rectifying junctions 34 and 36 with the portions 28 and 30, respectively. The junction depths and diffusion profiles resulting from the above diffusions are discussed below.

Figure 7:
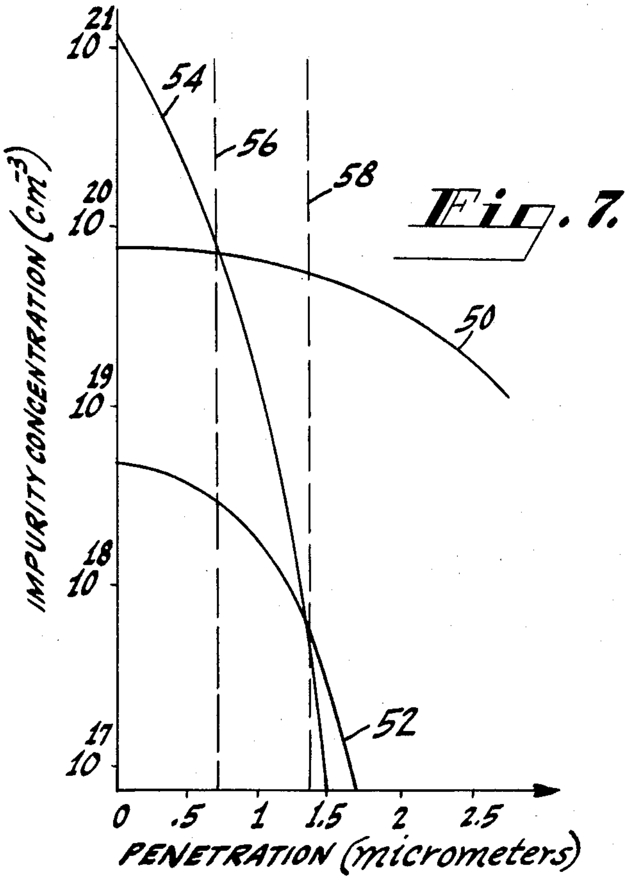
FIG. 7 is a graph which illustrates the diffusion profiles for the improved zener diode.

FIG. 7 illustrates the impurity concentration as a function of depth for both portions of the first region 26 and the second region 32. As shown by curve 50, the P+ portion 28 has a high surface impurity concentration of about $8 \times 10^{19}$ atoms/cm$^3$ and diffuses deeply into the N region 24. As shown by the curve 52, the P portion 30 has a significantly lower surface impurity concentration of about $5 \times 10^{18}$ atoms/cm$^3$ and does not diffuse as deeply into the N region 24. The N+ region 32, which is diffused into both portions of the first region 26, forms a rectifying junction at a different depth in each portion depending upon the depth at which their respective impurity concentrations equalize. As shown by the curve 54, the N+ region 32 has the highest surface impurity concentration of about $1.2 \times 10^{21}$ atoms/cm$^3$ but does not diffuse very deeply. The N+ impurity concentration 54 quickly falls below that of the P+ concentration 50, forming the P+N+ junction 34 at their intersection. The junction 34 is similar to that formed in prior art zener diodes; and as shown by dotted line 56, it is formed at the intersection of the curves 50 and 54 at a shallow depth of about 0.7 micrometers. However, the P impurity concentration 52 is substantially lower than that of the P+ concentration 50; and consequently, the N+ impurity concentration 54 remains above that of the P concentration 52 for a greater depth, forming the PN+ junction 36 at the greater depth of about 1.4 micrometers, as shown by the dotted line 58.

Figure 6:
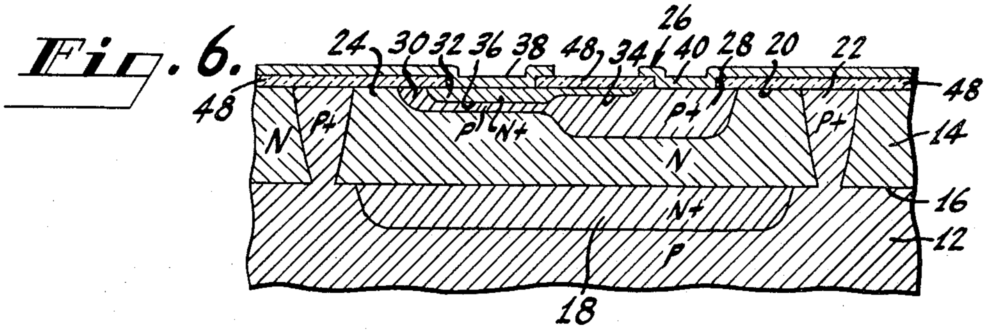

Electrical connection is then made to the improved zener diode 10 by the electrical contacts 38 and 40. As shown in FIG. 6, a new oxide coating 48 is laid down and opened up to expose a part of the surface 20 adjacent the N+ region 32 and another part of the surface 20 adjacent the P+ portion 28. The surface 20 adjacent the N+ region 32 is exposed only in the area where the N+ region 32 is disposed within the P portion 30 having the substantially lower impurity concentration and the substantially greater PN+ junction 36 depth. A coating of a highly conductive material is then deposited on the oxide coating 48 and the two exposed parts of the surface 20, and is selectively removed to yield the electrical contacts 38 and 40. Usually, the electrical contacts are made of aluminua which is vaporized onto the surface 20 and then heated to about 530° C to alloy it to the silicon. Since the electrical contact 38 to the N+ region 32 is made only in the area over the P portion 28 where the PN+ junction 36 is at a significantly greater depth, the chances of the aluminum spiking through the PN+ junction 36 and shorting the zener diode 10 are greatly reduced.

The desirable P+N+ characteristic of zener diodes is maintained with the improved zener diode 10 because the N+ region 32 extends into the zone of maximum conductivity of the portion 28 as described. Thus, when voltage breakdown occurs it occurs across the P+N+ junction 34. The P+N+ junction 34 has a voltage breakdown of about 5.5 volts but the PN+ junction 36 has a higher voltage breakdown of about 7.0 volts; consequently, the diode breaks down across the lower voltage P+N+ junction 34 even though the electrical contact to the N+ region 32 is only made above the PN+ junction 36.

What is claimed is:

1. A semiconductor device comprising:

a body of semiconductor material having a surface, means defining a zener diode in said body comprising a first region of one conductivity type containing two diffused portions, one of said portions having a high maximum impurity concentration and having a boundary at a predetermined depth with respect to said surface and the other portion having a significantly lower maximum impurity concentration and a boundary at a significantly lesser depth than said one portion, said body containing a second region of opposite type conductivity connected to both portions of said first region and separated from each by a PN junction, at least a part of the PN junction between said second region and said one portion being within the zones of maximum impurity concentration of each, a part of the other portion of said first region being at a significantly greater depth than the PN junction between said second region and said one portion of said first region; and an electrical contact to said second region only over said other portion of said first region where the PN junction is at a significantly greater depth.

2. A semiconductor device as defined in claim 1 wherein:

the maximum impurity concentration in said one portion of said first region is about $8 \times 10^{19}$ atoms/cm$^3$, the maximum impurity concentration in said other portion of said first region is about $5 \times 10^{18}$ atoms/cm$^3$, and the maximum impurity concentration in said second region is about $1.2 \times 10^{21}$ atoms/cm$^3$.

3. A semiconductor device as defined in claim 2 wherein:

the PN junction between said second region and said other portion of said first region is at a depth of about 1.4 micrometers with respect to said surface.

4. A semiconductor device as defined in claim 3 wherein said zener diode is an element of a microcircuit of the monolithic integrated type, said first region being disposed within an isolated region in said body of the same conductivity type as said second region.

* * * * *